United States Patent [19]

Steck

[11] Patent Number: 4,902,350

[45] Date of Patent: * Feb. 20, 1990

[54] METHOD FOR RINSING, CLEANING AND DRYING SILICON WAFERS

[75] Inventor: Ricky B. Steck, West Jordan, Utah

[73] Assignee: Robert F. Orr, Salt Lake City, Utah

[ * ] Notice: The portion of the term of this patent subsequent to Feb. 2, 2005 has been disclaimed.

[21] Appl. No.: 94,549

[22] Filed: Sep. 9, 1987

[51] Int. Cl.$^4$ ............................................. B08B 3/10
[52] U.S. Cl. ...................................... 134/1; 134/25.1; 134/25.4; 134/64 R; 134/135; 134/137; 134/140
[58] Field of Search ................... 134/25.1, 25.4, 64 R, 134/1, 137, 147, 184, 2

[56] References Cited

U.S. PATENT DOCUMENTS

| | | | |
|---|---|---|---|
| 4,079,522 | 3/1978 | Ham | 134/30 |
| 4,132,567 | 1/1979 | Blackwood | 134/25.4 |
| 4,318,749 | 3/1982 | Mayer | 134/25.4 |
| 4,458,703 | 7/1984 | Inoue et al. | 134/64 R |
| 4,537,511 | 8/1985 | Frei | 134/1 |
| 4,543,130 | 9/1985 | Shwartzman | 134/1 |
| 4,722,752 | 2/1988 | Steck | 134/25.4 |

Primary Examiner—Asok Pal

[57] ABSTRACT

Apparatus and method for cleaning, rinsing and drying thin wafers such as silicon wafers or other disc-like substrates or elements wherein the wafers are rinsed in a hot water bath while supported in a conventional slotted carrier. The wafers are cleaned and rinsed while being moved through a planar beam of sonic energy in a water bath. Drying of the wafers is achieved by slowly raising the wafers out of the water bath such that the water surface tension at the surface of the water bath evenly and effectively draws off water from the rinsing surfaces of the wafers. A novel lift mechanism is provided for moving the wafers through the beam of sonic energy in the water bath and for slowly lifting the wafers and the cassette in independent movements through the surface of the water such that there is no contact between the wafers and the cassette or between the cassette and any other object at the point where the cassette and wafers move through the surface of the water.

10 Claims, 3 Drawing Sheets

METHOD FOR RINSING, CLEANING AND DRYING SILICON WAFERS

BACKGROUND OF THE INVENTION

1. Field of the Invention

The present invention relates broadly to apparatus and methods of rinsing and drying silicon wafers or other wafers or thin disc-like substrates or elements in the semiconductor process industry. Further, the invention relates to integrated apparatus and methods of cleaning, rinsing and drying wafers, and in particular, to such apparatus and methods for cleaning, rinsing and drying wafers using sonic cleaning techniques.

2. State of the Art

In the processing of silicon wafers to make semiconductor devices, the wafers are subjected to a myriad of processing steps. It is practical to perform many of these steps on a batch of wafers positioned in a slotted carrier which is often referred to as a boat or as a cassette. The carriers have a plurality of spaced slots on the opposite vertical sides thereof for receiving the wafers in edgewise, coaxial, spaced relation. The carriers have openings in the bottom thereof for access to the bottom side edges of the wafers carried thereby. The top of the carriers are open to allow wafers to be inserted and removed therefrom.

Numerous cleaning, coating and diffusion steps are required in manufacturing semiconductor devices. Cleaning and removal of minute particles of dirt and residue from the surfaces of the wafers is a difficult operation. Most small particles of dust, dirt and grime are held rather firmly on the surfaces of the wafers. A vigorous cleaning action is required to remove such foreign matter from the wafers. Manual scrubbing of the wafers, while effective, is costly and destructive due to abrasion.

Immersion of the wafers in hot, chemical solutions has been found to be somewhat effective and is much more cost effective and amenable to mass production than manual scrubbing. To improve upon the effectiveness of the chemical immersion, it has been suggested to use ultrasonic and megasonic cleaning methods either concurrently with or as an adjunct to immersion in the chemical cleaning solutions. Heretofore, such chemical cleaning and sonic energy cleaning methods have been performed in specially adapted cleaning tanks, with the cleaned wafers then being removed from the cleaning tanks to be rinsed in a liquid rinse.

The industry has been using what is known as a spin rinser/dryer for many years to effect a final spray rinse and spin dry of the silicon wafers. The rinser/dryers are essentially centrifuges which throw water from the wafers and the carriers in which the wafers are contained. Because of the spinning action that occurs in these machines, the silicon wafers are subjected to high stress. In addition, silicon dust is generated and redeposited on the wafer surfaces along with other particulate accumulations. The semiconductor industry is moving toward much smaller device geometries in very large scale integration of making silicon devices, and the particulate accumulation on the smaller device geometries creates tremendous defect problems during the final rinse and dry of the wafers.

In my co-pending patent application, Ser. No. 06/874,383 now U.S. Pat. No. 4,722,752 filed Jun. 16, 1986, the entire contents of which are incorporated herein by reference, there is disclosed a method of rinsing and drying thin wafers such as silicon wafers, wherein the wafers are rinsed in a hot water bath while supported in a conventional slotted carrier. The wafers are dried by slowly raising the wafers out of the water bath such that the water surface tension at the surface of the water bath evenly and effectively draws water from the rising surfaces of the wafers. The wafers slowly rise out of the water bath in a dry state without being subjected to the high stress such as developed in the centrifuge type rinsers and dryers.

3. Objectives

A principal objective of the invention is to provide a novel, practical, integrated system for efficiently and simultaneously cleaning, rinsing and drying thin wafers such as silicon wafers which avoids the use of separate and distinct apparatus and methods for the cleaning, rinsing and drying steps.

A particular objective of the present invention is to provide compact, relatively inexpensive apparatus for cleaning, rinsing and drying thin wafers such as silicon wafers in an integrated procedure wherein the wafers are cleaned and rinsed in a tank of high purity, hot, deionized water, with the wafers being slowly passed through a sonic energy field in which they are subjected to sonic wave energy, and then, in a continuation of the slow movement through the energy field, the wafers are dried by slowly removing the wafers from the hot, deionized water in the tank.

A further objective of the present invention is to provide an integrated system in which the wafers are cleaned and rinsed in a tank using laminar, upward flow of high purity, hot, deionized water from the bottom of the tank, wherein the tank is provided with perimeter skimming or overflow to provide efficient removal of particulate contaminants.

An additional objective of the present invention is to provide a novel combination of apparatus comprising a lift mechanism and a cleaning, rinsing tank wherein the thin wafers are lifted from a support cassette while submerged in the hot, high purity, deionized water to first move through a sonic energy field in which the wafers are subjected to megasonic wave energy, and then to continue to move in a slow, continuous motion through the surface of the hot, deionized water to dry the wafers.

BRIEF DESCRIPTION OF THE INVENTION

The above objectives are achieved in accordance with the present invention by providing a novel method and apparatus for final cleaning, rinsing and drying of wafers and thin disc-like substrates or elements such as silicon wafers using a bath of high purity, hot, deionized water. The wafers, contained on a support means are submerged in a tank of hot, deionized water. The hot, deionized water is made to flow upwardly in a laminar flow pattern through the interior of the tank to remove particulates suspended in the water. An overflow of water from at least a portion of the perimeter of the tank effects a very efficient skimming action on the surface of the hot, deionized water, to thereby remove the particulates as they are flushed to the surface. The liquid laminar flow and surface skimming essentially reduces chances of particulates redepositing on the wafers.

Cleaning of the wafers is achieved by slowly moving the wafers through a beam of very high frequency, sonic energy which is maintained in the water bath. A transducer, which is adapted to oscillate at a frequency of between about 0.04 and 5 MHz, is disposed within the tank containing the hot, deionized water. The transducer is preferably mounted at or adjacent one of the vertical walls of the tank and directs a beam of sonic energy generally across the body of water in the tank. The sonic energy will preferably be in the megasonic range, i.e., the frequency of the wave energy will range between about 0.2 and 5 MHz.

A novel, vertical lift mechanism is provided for lifting the silicon wafers from a position submerged in the body of water beneath the beam of sonic energy and to slowly move the wafers transversely through the beam of sonic energy in the tank. The mechanism, if so desired, can be adapted to move the wafers up and down several times through the beam of sonic energy. Following the movement of the wafers upwardly through the beam of sonic energy (the final upward movement through the beam if the mechanism is adapted to move the wafers up and down several times through the beam of sonic energy), the wafers are slowly lifted through the surface of the body of hot, deionized water. In one preferred embodiment of the invention, the lift mechanism is adapted to temporarily terminate the generation of the beam of sonic energy and then slowly lift the wafers and a cassette from which the wafers have been removed from the water bath in distinct, separate, independent operations, with a final step of replacing the wafers in the cassette after both the wafers and the cassette have been removed from the water bath. In this latter embodiment, the lift mechanism comprises support structure for supporting the cassette, lift elements for lifting the wafers, and separate, independent means of moving both the support structure and the lift elements in substantially vertical movement relative to the tank containing the water bath.

Means are provided for positioning the support structure and a mutually respective cassette containing a complement of wafers to be cleaned and rinsed at a lowered position in the tank. Generation of the beam of sonic energy is then begun, so that the cassette and associated wafers are positioned beneath the beam of sonic energy. The lift elements then engage the bottom edges of the wafers through the opening in the bottom of the cassette. The lift elements move upwardly in a continuous motion such that the wafers are lifted from the cassette, slowly moving through the beam of sonic energy in the water bath. Then in a continued slow upward movement of the lift elements, the wafers ultimately rise above the surface of the water bath. In a modified version of the process, the lift elements move slowly in a reciprocal up and down motion before making the final upward movement in which the wafers are lifted above the surface of the water bath. During the reciprocal movement, the wafers move up and down through the beam of sonic energy.

After the lift elements have moved the wafers in a final movement through the beam of sonic energy in the water bath, the generation of the beam of sonic energy is temporarily terminated, and the support structure begins a slow upward movement through the tank to ultimately raise the empty cassette above the surface of the water bath in the tank. Once above the water bath, the empty cassette reengages the wafers, and the dry cassette containing the cleaned, rinsed, dry wafers is then removed from the support structure. Another cassette containing wafers which are to be cleaned and rinsed can then be placed on the support structure. The support structure and the lift elements then move downwardly into the tank to the lowered position beneath the beam of sonic energy in the body of water in the tank to begin a new cleaning and rinsing cycle.

Additional objects and features of the invention will become apparent from the following detailed description, taken together with the accompanying drawings.

THE DRAWINGS

A preferred embodiment of apparatus of the present invention representing the best mode presently contemplated of carrying out the invention is illustrated in the accompanying drawings in which:

FIG. 1 a is a top, plan view of cleaning, rinsing and drying apparatus in accordance with the invention;

FIG. 2 is a vertical cross section taken along line 2—2 of FIG. 1, showing the lift element and the support structure of the lift mechanism in the extreme lowered position; and FIG. 3 is a vertical cross section taken along line 3—3 of FIG. 1, again showing the lift element and support structure of the lifting mechanism in the extreme lowered position; and FIG. 4 is a cross section similar to FIG. 3, but showing the lift element and the wafers carried thereby at a position in which the wafers have emerged from the water bath and the cassette is just beginning to emerge from the water bath.

DETAILED DESCRIPTION OF THE ILLUSTRATED EMBODIMENTS

Figure 1:
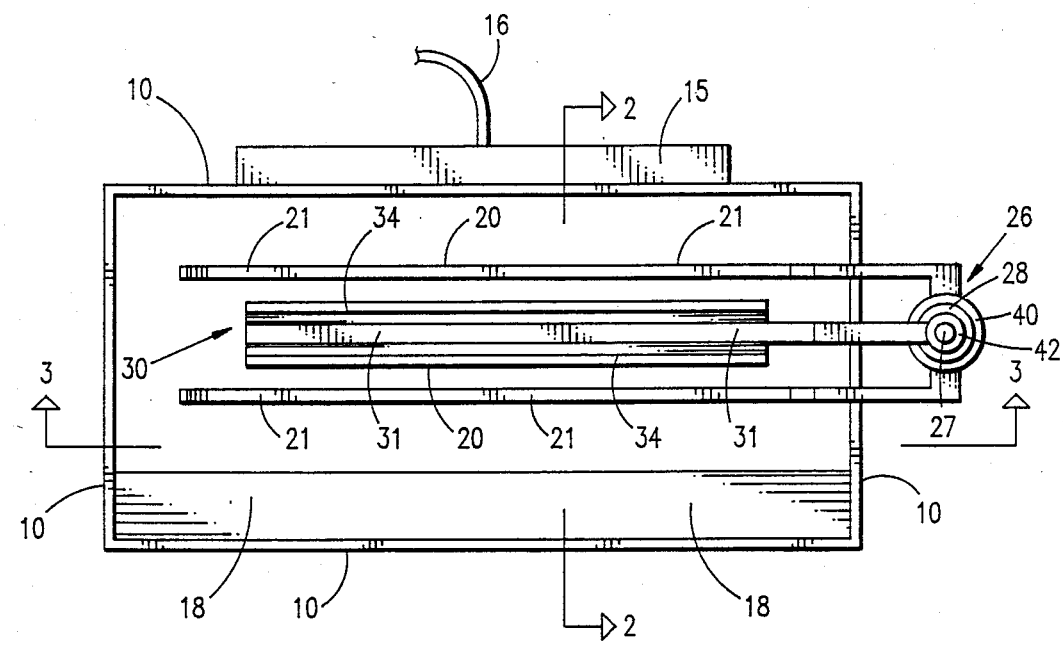
Figure 2:
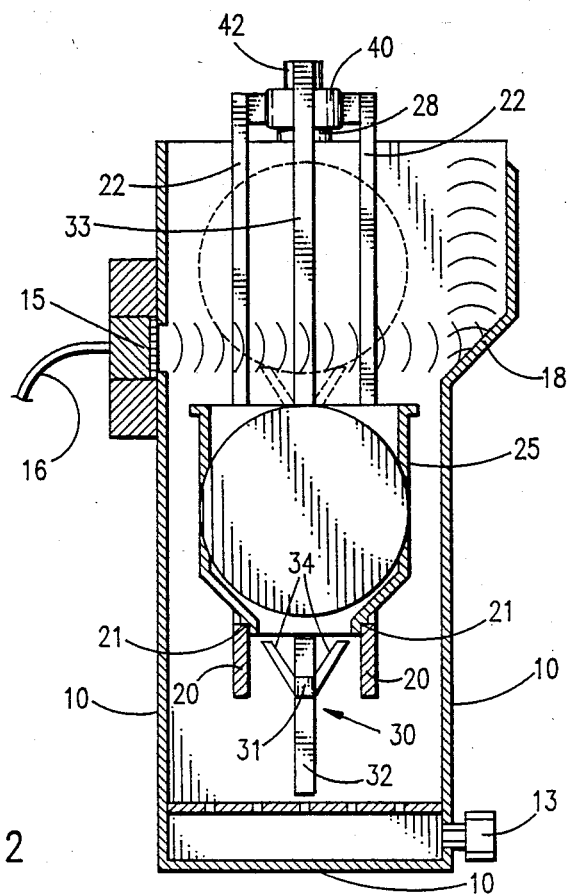

As illustrated, the invention comprises a cleaning and/or rinsing tank 10 which is filled with high purity, hot, deionized water. The temperature of the water is between at least about 70 to 90 degrees centigrade and preferably between about 85 to 90 degrees centigrade. A diffuser 11 is positioned within the tank 10 adjacent to the bottom of the tank 10. Hot, purified, deionized water is introduced into the tank 10 through the diffuser 11 to create a laminar flow of hot, deionized water upwardly through the tank 10. As best shown in FIG. 1, an inlet nozzle 13 is provided at the bottom of the tank 10 for introducing the purified, hot, deionized water into the plenum between the diffuser 11 and the bottom of the tank 10.

The hot, deionized water passes through the diffuser 11 and flows upwardly in substantially laminar flow within the tank 10. A peripheral overflow allows the hot, deionized water to drain from the top portion of the tank 10 by overflowing the periphery of the tank 10. The laminar flow of hot, deionized water rinses semiconductor wafers which are placed in the tank 10, and the upward flow of water, with the peripheral overflow, removes any particulates which are suspended in the hot, deionized water. The peripheral overflow creates a very efficient skimming effect on the surface of the water in the tank 10.

The wafers can be given an effective final cleaning in the tank 10 while simultaneously being rinsed by the hot, deionized water. To this end, means are provided for propagating a beam of sonic energy (preferably megasonic energy) which passes in a substantially horizontally orientation across the body of water in the tank 10. A sonic transducer 15 is provided along one of the sides of the tank 10. The transducer 15 is an elongate device which produces an essentially planar beam of sonic energy that sweeps substantially horizontally across the body of water in the tank 10 The transducer 15, which is commercially available, is operated at a frequency of between about 0.04 and 5 MHz, preferably between about 0.2 and 2 MHz. The transducer is energized through appropriate leads 16 which are in turn connected to a conventional, tuned, high frequency amplifier. The amplifier system is well known in the art and is not shown in the drawings, nor does it require further description herein. Operation of the apparatus, including the sonic cleaning components will be more fully described hereinafter.

It has been found that in the rinsing of the wafers, irrespective of whether a sonic cleaning step is simultaneously included or not, drying of the wafers can be very efficiently done by slowly lifting the wafers through the surface of the flowing hot water. The surface tension at the interface of the hot water bath and the respective wafers effectively draws water from the surfaces of the wafers. Essentially, by very slowly removing the wafers and the cassette assembly from the surface of the water, the capillary action at the interface with the surface of the water draws water from the wetted surfaces of the wafers and cassette assembly. The rate of movement of the wafers and the cassette should be about between about 1 to 4 inches per minute, preferably about 2 to 3 inches per minute.

If, however, the wafers and the cassette holding the wafers are raised through the surface of the water together, i.e., with the side edges of the wafer engaged in the retention slots in the cassette, water is trapped and remains in the slots in the cassette around the edges of the wafers. The retained water causes water spotting on the edges of the wafers, and, in some instances, the drops of water caught in the slots in the cassette can run across the faces of the wafers after the cassette is removed from the water bath. Water running across the face of a wafer can cause serious damage to the entire wafer.

It has been found that if the wafers can be independently moved through the surface of the water bath such that at the interface with the surface of the water bath, the wafer is not in contact with the cassette, the water is drawn uniformly from the wafers and the surface of the wafer rising above the water will be dry. Likewise, it has been found that if the cassettes are moved independently through the surface of the water bath such that at the interface with the surface of the water, the cassette is not in contact with the wafers, the water is drawn uniformly from the cassettes, and even the slots in the cassettes will be dry as they rise above the water. A special lift mechanism must be provided to accomplish the independent movement of the wafers and the cassette through the surface interface of the water bath.

The special lift mechanism comprises a support structure positioned within the tank 10 for supporting at least one cassette and it mutually respective batch of wafers. The support structure must recede into the tank 10 such that the cassette and the batch of wafers carried therein are completely submerged beneath the surface of the hot, deionized water in the tank 10. When the sonic cleaning step is to be performed simultaneously with the rinsing, the support structure must recede into the tank 10 such that the cassette and the batch of wafers carried therein are submerged beneath the beam of sonic energy which is generated across the body of water in the tank 10.

In the illustrated embodiment, the support structure comprises a pair of support plates 20 positioned in parallel within the tank 10. The support plates 20 are supported from a lift means which can lift the plates 20 up and down within the tank 10. Each of the support plates 20 has an edge ledge 21 upon which the cassette 25 is received, as best shown in FIG. 1. The pair of plates 20 are spaced such that the flat ledges 21 on the respective pair of plates 20 form a lengthwise support for respective, longitudinal, bottom side edges of the cassette 25.

As illustrated, each pair of plates 20 in the tank 10 are connected to connector arms 22 which extend upwardly above the top of the tank 10. These connector arms 22 are in turn attached to a lift mechanism for moving the plates 20 up and down. The lift mechanism comprises a dual piston hydraulic system 26 positioned adjacent to the tank 10. The connector arms 22 are connected to one of the pistons of the hydraulic system 26 as will be described more fully hereinafter.

At least one lift element 30 is provided within the tank 10 for independently lifting respective batches of wafers from the cassette 25. The lift element 30, as illustrated, comprises an elongate bottom member 31 which is positioned between respective support plates 20 of the support structure for the cassette 25. The bottom member 31 is adapted to move upwardly and downwardly in parallel fashion between the corresponding support plates 20 of the support structure.

Figure 3:
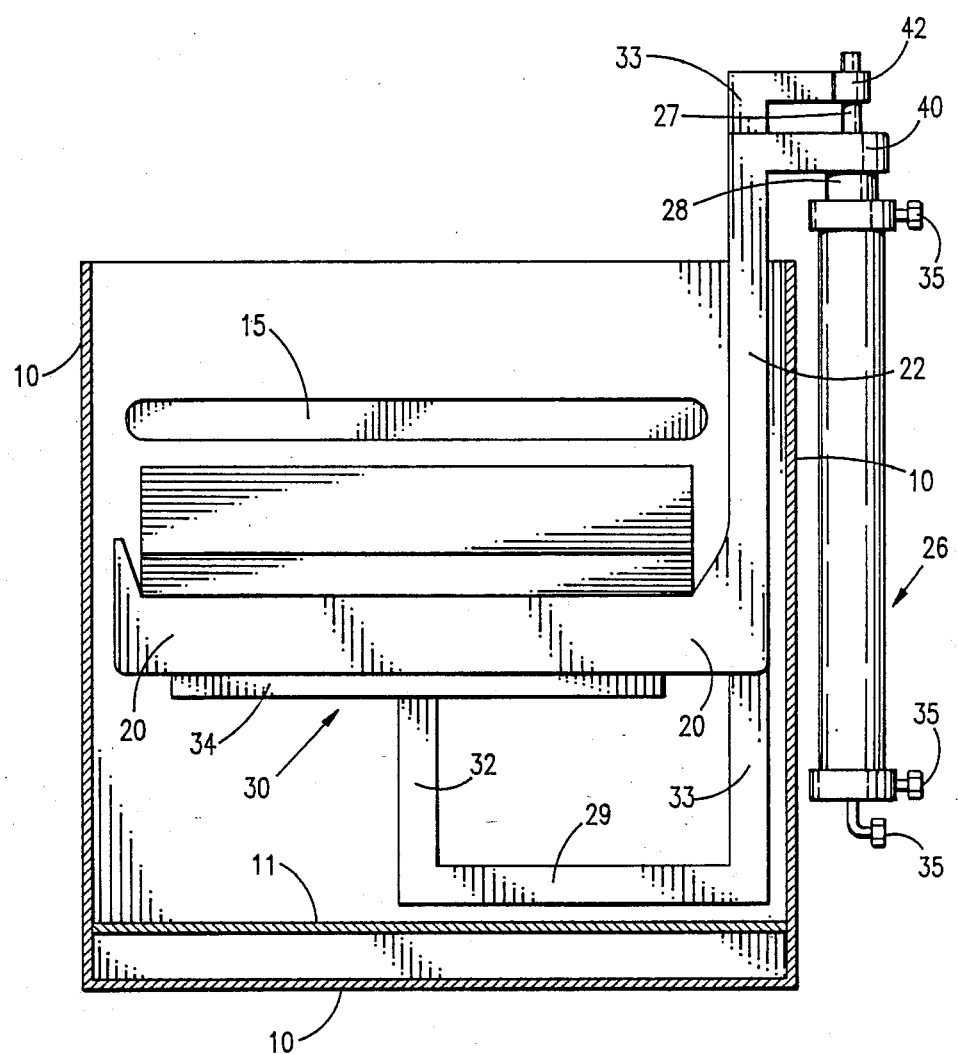

The bottom member 31 is supported on the top of a vertically oriented leg 32 which is in turn attached at its bottom end to the bottom of a vertically oriented connector arm 33 by way of a horizontal support member 29. The leg 32 is adapted to move from a lowered position (FIG. 3) beneath a cassette 25 supported on the support plates 20, through the opening in the bottom of the cassette 25 to an elevated position (FIG. 5) extending through the cassette 25.

Similar to the connector arms 22 of the support plates 20, the connector arm 33 extends upwardly above the top of the tank 10. The connector arm 33 is also attached to a lift mechanism for moving the lift elements 30 up an down. The lift mechanism comprises a dual piston hydraulic system 26 positioned adjacent to the tank 10. The connector arms 33 are connected to one of the pistons of the hydraulic system 26 as will be described more fully hereinafter.

Engagement means are provided along the elongate bottom member 31 of the lift element 30 for engaging the bottom edges of wafers in a mutually respective cassette 25 and lifting the wafers upwardly out of the cassette 25 as the lift element 30 moves from its lowered position to its elevated position. As illustrated, the engagement means comprises a pair of elongate slats 34 which extend outwardly and upwardly from the elongate bottom 31 of the lift element 30. As is well known in the semiconductor processing art, the slats 34 are provided with slots which engage the bottom edges of the wafers as the slats 34 move upwardly. Such engagement means are well known in other apparatus used in transferring wafers from one carrier or cassette to another, and further description of the engagement system is not deemed necessary.

In operation, the apparatus is used to accomplish a novel method of rinsing and drying silicon wafers. The wafers to be rinsed and dried are supported edgewise along the opposite sides of a slotted carrier, such as a cassette 25. The wafers are supported in the cassette 25 in spaced, parallel, coaxial relation. The cassette 25 is supported on the support ledges 21 of a respective pair of support plates 20.

The cassette 25 and its batch of wafers are submerged beneath the surface of the hot, deionized water in tank 10. Hot, deionized water is introduced into the tank 10 through the diffuser 11 to create a liquid laminar flow of hot, deionized water upwardly through the tank 10 and about the wafers and cassette 25 which are submerged in the water in the tank 10. The wafers and cassette 25 are left submerged in the tank 10 for a time sufficient to rinse the wafers.

Following the rinse, the wafers and cassette 25 are slowly raised from the water in the tank 10 to effect simultaneous drying and removal of the wafers. In a first movement, the cassette 25 and the wafers supported therein are slowly raised to a position in which the upper edges of the cassette 25 are positioned immediately beneath and adjacent to the surface of the hot, deionized water in the tank 10.

Raising of the cassette 25 in this first movement is accomplished by appropriate means such as the hydraulic system 26 for moving the support plates 20 upwardly within the tank 10. The hydraulic system 26 comprises a pair of pistons 27 and 28. Advantageously, the pistons are of the coaxial type in which the outer piston 28 forms a sleeve about the inner piston 27. The pistons 27 and 28 are driven independently by hydraulic fluid as is well known in the art. The connector arms 22 of the support plates 20 are connected to a block 40, and the block 40 is in turn connected, such as by threaded engagement, with the outer piston 28. The piston 28 is driven upwardly in the first movement described above, to a controlled position wherein the cassette 25 and the wafers contained therein are located immediately beneath the surface of the water in the tank 10.

Following the completion of the first movement, the lift element 30 is slowly raised upwardly in a second movement. The leg 32 and bottom member 31 of the lift element 30 are raised through the opening in the bottom of the cassette 25, with the slats 34 engaging the bottom edges of the wafers. As the leg 32 continues to rise through the cassette 25, the wafers are slowly lifted out of the cassette 25 and through the surface of the water in tank 10 to a position just above the surface of the water in tank 10.

Raising of the lift element 30 in this second movement is accomplished by appropriate means such as the inner piston 27 of the hydraulic system 26. The connector arm 33 of the lift element 30 is connected to a block 42 which is, in turn, connected to the inner piston 27.

As the wafers emerge from the surface of the water, the only contact made with the wafers by another object is that of the slats 34 of the lift element 30. This contact is minimal and is located at the bottom edge of the wafers. Water from the emerging surfaces of the wafers is drawn off by water surface tension at the interface of the water surface and the wafers. The portions of the wafers above the water surface dry immediately at the water surface as the wafers slowly rise out of the water.

Upon completion of the second movement, wherein the wafers are raised to the position just above the surface of the water in tank 10, the slotted carrier or cassette 25 is slowly raised upwardly in a third movement. The cassette 25 slowly rises through the surface of the water, and as the cassette 25 passes through the surface of the water, the emerging portions of the cassette 25 are immediately dried. The water on such portions is immediately and effectively drawn off by water surface tension at the interface of the water surface and the cassette 25. It has unexpectedly been found that even the empty slots in the sides of the cassette 25, which are otherwise used to hold wafers, dry completely as they slowly rise out of the water. This is the opposite of what happens if the slots contain the edges of the wafers when the slots emerge from the water. In the latter situation, water is held between the edges of the wafers and the slots as mentioned hereinbefore.

The dry slots in the cassette 25 rise sufficiently to reengage the side edges of the wafers above the surface of the water. Because the slots and wafers are both dry, there is no problem with water spotting and contamination of the wafers. The cassette 25 continues to move upwardly to support and lift the wafers completely free of the slats 34 of the lift element 30. Any water remaining on the wafers from their contact with the slats 34 dries immediately, and water spotting in the very small contact points at the bottom edges of the wafers does not adversely effect the quality of the wafers.

Raising of the cassette 25 in the third movement is accomplished by appropriate means such as the outer piston 27 of the hydraulic system 26. The movement of each of the pistons 27 and 28 of the hydraulic system 26 is readily controlled by controlling the flow of hydraulic fluid to the hydraulic system 26 through nipples 35 on the hydraulic system 26. The source of hydraulic fluid is not shown in the drawings. Hydraulic pumps and controls therefore are well know in the art.

After the cassette 25 and wafers have been raised completely out of the water, the dried cassette containing the rinsed and dried wafers is removed from the support plates 20 of the lift element 30. Another cassette containing additional wafers can then be placed on the support plates 20, and the support plates 20 are then retracted or lowered such that the cassette and wafers are completely submerged in the water. The rinsing and drying operation as described above can then be repeated.

As mentioned previously, the apparatus of the present invention advantageously comprises means for generating sonic energy within the body of water in the tank 10, and it has been found that the wafers can simultaneously be given an exceptionally efficient final cleaning along with the rinsing and drying as described above. When the apparatus is being used to accomplish simultaneous cleaning along with the rinsing and drying, the wafers which are to be cleaned, rinsed and dried are supported in a slotted carrier, such as the cassette 25, and the cassette 25 containing the batch of wafers is submerged beneath the surface of the hot, deionized water in tank 10.

The cassette 25 and its batch of wafers are lowered into the tank 10 to a position in which they are located completely beneath the level of the transducer 15 on the side of the tank. Hot, deionized water is introduced into the tank 10 through the diffuser 11 to create a liquid laminar flow of hot, deionized water upwardly through the tank 10 and about the cassette 25 and the wafers associated therewith. The transducer 15 is electrically activated to produce a planar beam of sonic energy directed across the body of water in tank 10.

Following submergence of the cassette 25 containing the wafers which are to be cleaned, rinsed and dried, the lift element 30 is moved upwardly in a first continuous movement to lift the wafers from the cassette 25 and then to move the wafers through the planar beam of sonic energy. Raising of the lift element 30 and the respective wafers in this first movement is accomplished by the hydraulic system 26 as described previously.

During this first movement in the cleaning, rinsing and drying procedure, the wafers pass slowly through the planar beam of sonic energy produced by the transducer 15. Preferably, the wafers are positioned or oriented on the lift element 30 such that the planar beam of sonic energy is directed parallel with the surfaces of the wafers. As the wafers move through the beam of sonic energy, the surfaces thereof are effectively cleaned and rinsed. Minute particular matter is scoured from the surfaces of the wafers by the action of the planar beam of sonic energy, and all freed particulate matter is swept upwardly and rinsed away by the laminar flow of water in the tank 10. It is advantageous to have the water in the tank 10 overflow the perimeter of the tank in at least the area in which the vertically reflected, sonic, energy waves intersect the surface of the water. The reflected, sonic, energy waves coact with the upward flow of water to sweep particulate matter upwardly, and the overflow adjacent to the area of the reflected, sonic, energy waves acts to effectively remove the particulate matter from the tank 10.

Figure 4:
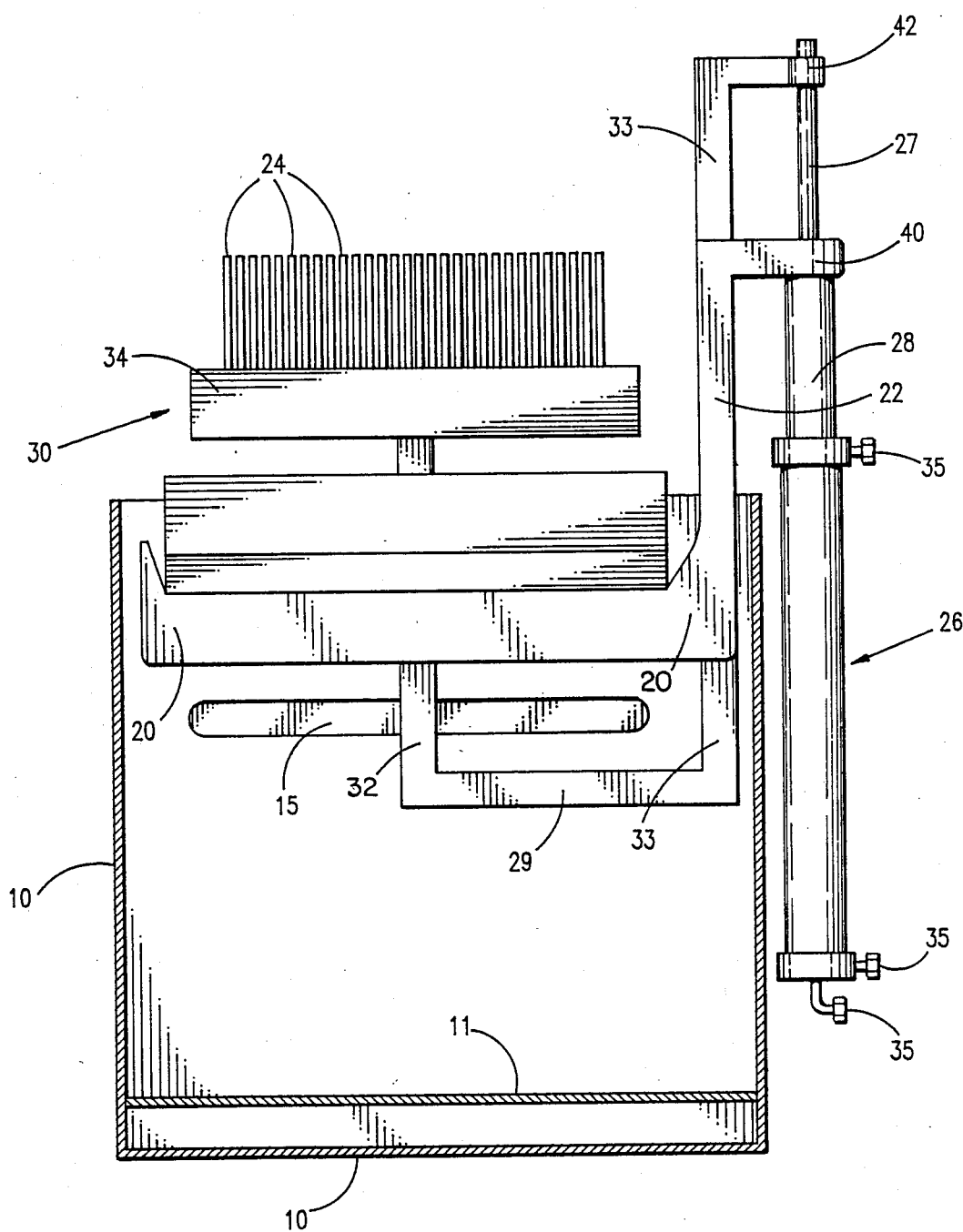

In this first movement, the lift element 30 is slowly raised upwardly through the opening in the bottom of the cassette 25, with the slats 34 of the lift element 30 engaging the bottom edges of the wafers in the cassette 25. As the leg 32 of the lift element 30 continues to rise through the cassette 25, the wafers are slowly lifted from the cassette 25 and then transported through the planar beam of sonic energy in the tank 10. The lift element 30 can at this point be made to move in a reciprocal up and down movement so as to cause the wafers to move up and down several times through the beam of sonic energy. In the final upward movement, the lift element 30 continues to rise slowly until the slats 34 thereof and the wafers 24 (FIG. 4) carried by the slats 34 are raised above the surface of the body of water in tank 10. The surfaces of the wafers dry immediately as the surfaces emerge from the water.

After the lift element 30 has lifted the wafers from the cassette 25 and through the planar beam of sonic energy, the power to the transducer producing the sonic waves is disconnected so as to temporarily terminate the generation of the beam of sonic energy. The support plates 20 and the cassette 25 then begin to move upwardly at the same rate as the lift element 30. Once the lift element 30 has reached the upper limit of its travel, the support plates 20 and cassette 25 continue to move upwardly so as to ultimately move through the surface of the body of water in tank 10 and catch up with the lift element 30 above the surface of the body of water. As the cassette 25 passes slowly through the surface of the water, the emerging portions of the cassette are immediately dried as described previously. The dry cassette 25 ultimately catches up to the lift element 30 and the dried wafers 24, and the cassette 25 reengages the wafers 24 and lifts the wafers 24 from the lift element 30. Further raising of the cassette 25 then lifts the cassette 25 and wafers 24 from the lift element 30, and the cassette 25 and wafers 24 can be removed from the apparatus. Operation of the support plates 20 and the cassette 25 in this second movement is accomplished by the hydraulic system 26 as described previously.

After the cassette 25 and wafers 24 have been reengaged, the dried cassette containing the cleaned, rinsed and dried wafers 24 is removed from the support plates 20 of the lift element 30. Another cassette containing additional wafers can then be placed on the support plates 20, and the lift element 30 retracted or lowered such that the cassette and wafers are completely submerged in the water beneath the planar beam of sonic energy. The cleaning, rinsing and drying operation as described above can then be repeated.

Although a particularly preferred embodiment of the apparatus of the present invention has been illustrated, and two preferred methods of rinsing and/or cleaning wafers have been described, it is to be understood that the present disclosure is made by way of example and that various other embodiments of the invention are possible without departing from the subject matter coming within the scope of the following claims, which subject matter is regarded as the invention.

It is to be recognized that in the broadest aspect of the present invention, a single lift mechanism can be used for moving the wafers in place of the double lift mechanism shown in the drawings and described hereinbefore. The wafers could be initially placed on a support mechanism above the surface of the water, with the support mechanism engaging only the bottom edges of the wafers in a manner similar to the engagement by the elongate slats 34 of the lift element 30 as described and illustrated hereinbefore. The support mechanism and the wafers could then be lowered beneath the surface of the water by the single lift mechanism for rinsing and cleaning of the wafers. Following rinsing and cleaning, the support mechanism would slowly raise the wafers from the body of water, and the wafers could then be removed from the support mechanism.

It should also be specifically recognized that a dual lift mechanism as illustrated and described herein could be replaced with a single lift mechanism even when a cassette of wafers is initially placed on the support mechanism. In this latter embodiment, the support mechanism would be adapted to automatically raise the wafers slightly from their support in the cassette (such that the wafers would not touch the cassette) as the cassette is placed on the support mechanism. Then the support mechanism could be moved to submerge the cassette and wafers for cleaning and rinsing of the wafers. Following cleaning and rinsing, the support mechanism would raise the cassette and wafers from the body of water. Upon lifting the cassette from the support mechanism, the wafers would be automatically reengaged by the cassette.

I claim:

1. A method of cleaning, rinsing and drying relatively thin, plate-like articles which can be supported edgewise, said method comprising the steps of:
   (a) maintaining a body of hot, deionized water contained in a tank;
   (b) placing articles to be cleaned, rinsed and dried in a slotted carrier wherein the articles are supported edgewise along the opposite sides of said slotted carrier in spaced, parallel, coaxial relation;
   (c) submerging said slotted carrier and the articles which are to be cleaned, rinsed and dried in the body of hot, deionized water contained in the tank;
   (d) introducing hot, deionized water into said tank through a diffuser to create a laminar flow of hot, deionized water upwardly through said tank and about said articles and slotted carrier which are submerged in the body of hot, deionized water;
   (e) producing a beam of sonic energy in the body of hot, deionized water in said tank above said articles and slotted carrier;

(f) slowly raising a lift element upwardly through an opening in the bottom of said slotted carrier to (1) engage the bottom edges of said articles, (2) slowly lift the articles out of the slotted carrier, (3) slowly move the articles through the beam of sonic energy in the body of water and (4) slowly move the articles through the surface of the body of hot, deionized water in said tank to a position above the surface of the body of hot, deionized water in said tank; and (g) slowly raising the slotted carrier upwardly such that the slotted carrier (1) follows at a spaced distance the respective lift element and articles through the body of hot, deionized water and the surface of the body of hot deionized water in said tank and then (2) reengages the articles at a position above the surface of the body of hot, deionized water in said tank, wherein the movement of said slotted carrier and said lift element is sufficiently slow that the deionized water is drawn from the articles and the slotted carrier by water surface tension as the articles and slotted carrier move across the interface with the surface of the deionized water.

2. A method in accordance with claim 1, wherein the rate of upward movement of the lift element as it moves the articles through the surface of the body of hot, deionized water is between about 1 and 4 inches per minute, and the rate of upward movement of the slotted carrier is the same as that of the lift element.

3. A method in accordance with claim 1, wherein the beam of sonic energy has a frequency of between about 0.2 and 5 MHz.

4. A method in accordance with claim 1, wherein the lift element moves in alternating up and down motion in step f(3) to move the articles back and forth in an up and down motion through the beam of sonic energy.

5. A method of rinsing and drying relatively thin, plate-like articles which can be supported edgewise, said method comprising the steps of:

(a) maintaining a body of hot, deionized water contained in a tank;

(b) placing articles to be rinsed and dried in a slotted carrier where in the articles are supported edgewise along the opposite sides of said slotted carrier in a paced, parallel, coaxial relation;

(c) submerging said slotted carrier and the articles which are to be rinsed and dried in the body of hot, deionized water contained in the tank;

(d) introducing hot, deionized water into said tank through a diffuser to create a laminar flow of hot, deionized water upwardly through said tank and about said articles and slotted carrier which are submerged in the body of hot, deionized water;

(e) maintaining the articles and slotted carrier submerged in said tank for a time sufficient to rinse said articles;

(f) slowly raising a lift element upwardly through an opening in the bottom of said slotted carrier to (1) engage the bottom edges of said articles, (2) slowly lift the articles out of the slotted carrier and (3) slowly move the articles through the surface of the body of hot, deionized water in said tank to a position above the surface of the body of hot, deionized water in said tank; and (g) slowly raising the slotted carrier upwardly such that the slotted carrier (1) follows at a spaced distance the respective lift elements and articles through the surface of the body of hot deionized water in said tank and than (2) reengages the articles at a position above the surface of the body of hot, deionized water in said tank, wherein the movement of said slotted carrier and said lift element is sufficiently slow that the deionized water is drawn from the articles and the slotted carrier by water surface tension as the articles and slotted carrier move across the interface with the surface of the deionized water.

6. A method in accordance with claim 5, wherein the rate of upward movement of the lift element is between about 1 and 4 inches per minute, and the rate of upward movement of the slotted carrier is the same as that of the lift element.

7. A method of cleaning, rinsing and drying relatively thin, plate-like articles comprising the steps of:

(a) maintaining a body of hot, deionized water contained in a tank;

(b) placing articles to be cleaned, rinsed and dried on a support means wherein the articles are supported edgewise along the support means in spaced, parallel, coaxial relation;

(c) submerging said support means and the articles which are to be cleaned, rinsed and dried in the body of hot, deionized water contained in the tank;

(d) introducing hot, deionized water into said tank through a diffuser to create a laminar flow of hot, deionized water upwardly through said tank and about said articles and support means which are submerged in the body of hot, deionized water;

(e) producing a beam of sonic energy in the body of hot, deionized water in said tank above said articles and support means; and (f) slowly raising said support means (1) through the beam of sonic energy in the body of water and then (2) through the surface of the body of hot, deionozed water in said tank to a position above the surface of the body of hot, deionized water in said tank;

wherein the movement of said support means and said articles is sufficiently slow that the deionized water is drawn from the articles and the support means by water surface tension as the articles and support means move across the interface with the surface of the deionized water.

8. A method in accordance with claim 7, wherein the rate of upward movement of the support means as it moves the articles through the surface of the body of hot, deionized water is between about 1 and 4 inches per minute.

9. A method in accordance with claim 7, wherein the beam of sonic energy has a frequency of between about 0.2 and 5 MHz.

10. A method in accordance with claim 7, wherein the support means moves in alternating up and down motion in step f(2) to move the articles back and forth in an up and down motion through the beam of sonic energy.

* * * * *